(12) United States Patent
Ball et al.

(10) Patent No.: US 8,693,149 B2
(45) Date of Patent: Apr. 8, 2014

(54) TRANSIENT SUPPRESSION DEVICE AND METHOD THEREFOR

(75) Inventors: Alan R. Ball, Gilbert, AZ (US); Stephen P. Robb, Fountain Hills, AZ (US)

(73) Assignee: Semiconductor Components Industries, LLC., Phoenix, AZ (US)

( * ) Notice: Subject to any disclaimer, the term of this patent is extended or adjusted under 35 U.S.C. 154(b) by 611 days.

(21) Appl. No.: 12/469,544

(22) Filed: May 20, 2009

(65) Prior Publication Data

US 2010/0296210 A1    Nov. 25, 2010

(51) Int. Cl.
*H02H 9/00* (2006.01)

(52) U.S. Cl.
USPC ............................................................ 361/56

(58) Field of Classification Search
USPC ................ 361/56; 257/328, E21.41; 438/268
See application file for complete search history.

(56) References Cited

U.S. PATENT DOCUMENTS

| | | | | |
|---|---|---|---|---|
| 6,072,682 | A * | 6/2000 | Ravanelli et al. | 361/111 |
| 6,284,616 | B1 * | 9/2001 | Smith | 438/364 |
| 6,768,616 | B2 * | 7/2004 | Mergens et al. | 361/56 |
| 7,102,199 | B2 | 9/2006 | Robb et al. | |
| 7,746,609 | B2 * | 6/2010 | Kim | 361/56 |
| 7,768,753 | B2 * | 8/2010 | Fankhauser et al. | 361/56 |
| 2004/0080880 | A1 * | 4/2004 | Yang et al. | 361/56 |
| 2006/0209479 | A1 * | 9/2006 | Grombach et al. | 361/56 |

OTHER PUBLICATIONS

Central Semiconductor Corp., "CMXSTB Series Surface Mount Forward Reference Diode (Stabistor)", Data, Sheet, RO (Apr. 29, 2005), 2 pages.
National Semiconductor, "LM185-2.5/LM285-2.5/LM385-2.5 Micropower Voltage Reerence Diode", Data Sheet, Jan. 30, 2008, Copyright 2008 National Semiconductor Corporation, 16 pages.
Semiconductor Components Industries, LLC, "LM285, LM385B Micropower Voltage Reference Diodes", Data Sheet, Copyright 2008 Semiconductor Components Industries, LLC, Publication Order Number: LM285/D, Mar. 2008—Rev. 8, 9 pages.
Semiconductor Components Industries, LLC, "NUD4700 LED Shunt", Data Sheet, Copyright 2009 Semiconductor Components Industries, LLC, Publication Order Number: NUD4700/D, Jan. 2009—Rev. 7, 6 pages.

* cited by examiner

*Primary Examiner* — Jared Fureman
*Assistant Examiner* — Nicholas Ieva
(74) *Attorney, Agent, or Firm* — Robert F. Hightower

(57) ABSTRACT

In one embodiment, a semiconductor device to provide protection for electronic circuits, the semiconductor device typically includes a vertical MOS transistor, a reference circuit, and an amplifier. The amplifier amplifies the reference voltage to enable the vertical MOS transistor responsively to a transient event.

9 Claims, 4 Drawing Sheets

US 8,693,149 B2

TRANSIENT SUPPRESSION DEVICE AND METHOD THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form transient suppression devices (TSD). These transient suppression devices typically were utilized to protect electronic equipment from transient electrical disturbances such as an electrostatic discharge (ESD) or electromagnetically coupled interference. The transient electrical disturbances generally occurred at the terminals of electronic devices such as at the input and output terminals. The transient electrical disturbances could damage the electronics of the devices therefore the transient suppression devices were attached to the terminals of the electronic device to minimize damage. The transient suppression devices typically were zener diodes or a transistor coupled in a diode configuration. The transient suppressor devices typically had a high impedance which resulted in a large voltage change across the transient suppression device as the current conducted by the transient suppression device increased. The impedance usually was in the order of one to ten (1-10) ohms. Consequently, the knee of the V-I characteristic curve was soft.

Technology advancements lead to electronic devices operating at lower voltages. Because the voltage across the transient suppressor device increased as the conducted current increased, the prior transient suppression device generally was not able to adequately protect electronic devices that operated at lower voltages such as voltages below about five volts (5 V) and especially voltages at lower voltages such as three volts (3 V) or one and eight tenths of a volt (1.8 V) or less.

Accordingly, it is desirable to have a transient suppression device that has a lower impedance, that has a sharper knee of the V-I characteristic curve, that has a lower leakage current, and that operates at voltages of less than about five volts (5 V).

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
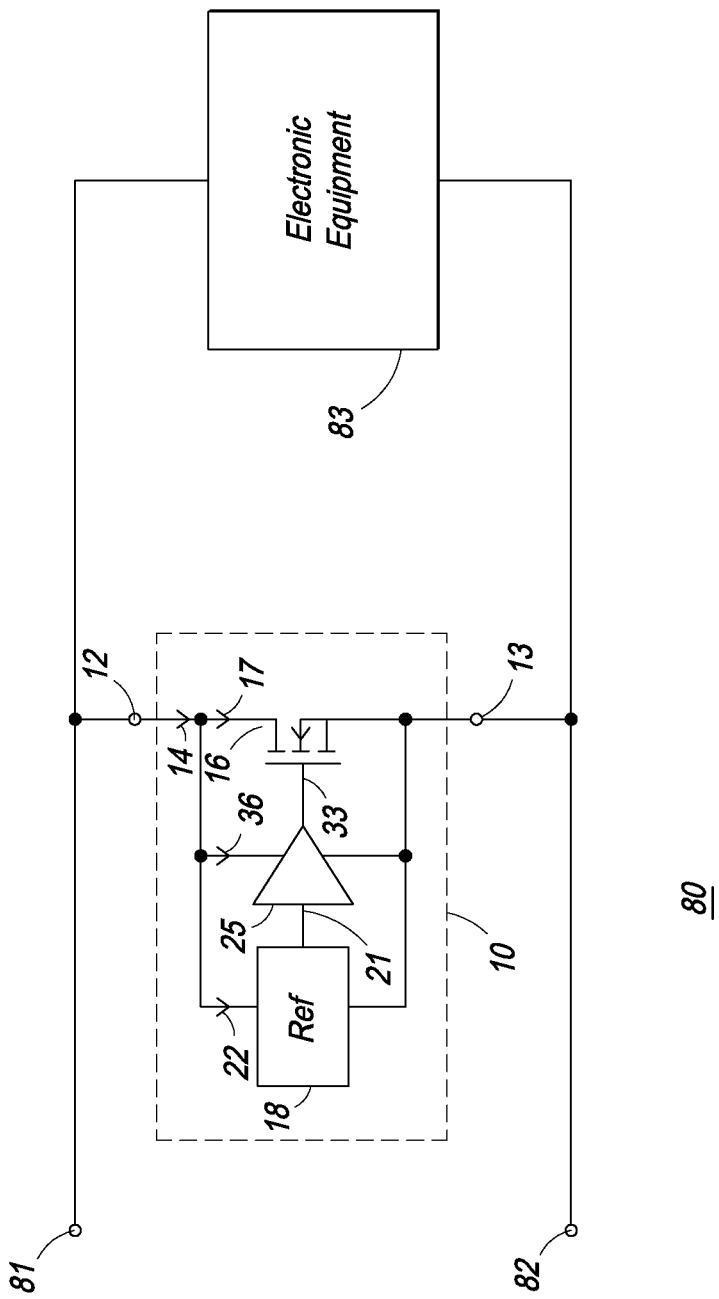
FIG. 1 schematically illustrates an embodiment of a portion of a system that includes a semiconductor device that provides protection in accordance with the present invention.

FIG. 1 schematically illustrates, in block diagram form, a portion of an exemplary embodiment of a system 80 that uses a semiconductor device 10, such as a protection device or clamping device or a transient suppression device (TSD), to provide transient protection for some type of electronic equipment 83. System 80 receives a signal between terminals 81 and 82 that is to be used by equipment 83. The signal received between terminals 81 and 82 may be an output of a power supply that is supplying operating power to equipment 83, or may be a data signal or other type of state or control signal that may be used by equipment 83. Device 10 is configured to assist in protecting equipment 83 from transients on the conductors of terminals 81 and 82. The value of the signal or voltage received on terminal 81 normally is within a normal operating range, such as less than a threshold value of device 10, and device 10 does not affect the value of the signal or voltage from terminal 81.

Device 10 is formed to have a low impedance and a sharp V-I characteristic curve in order to assist in protecting equipment 83. In one embodiment, device 10 is formed with a clamp voltage that is less than about five volts (5 V). Device 10 usually is configured as a two terminal device having an input terminal 12 and an output terminal 13. Device 10 also includes a vertical MOS transistor 16 that is coupled between terminals 12 and 13 to conduct a current 14 from terminal 12, through transistor 16 as a current 17, to terminal 13. A reference circuit 18 and an amplifier 25 of device 10 are coupled between terminals 12 and 13 to receive an input voltage from terminal 12. Reference circuit 18 includes an output 21 and amplifier 25 includes an output 33. As will be seen further hereinafter in the explanation of FIG. 6, transistor 16, reference circuit 18, and amplifier 25 generally are formed on a semiconductor substrate 51. In the preferred embodiment, transistor 16 is a vertical N-channel MOS power transistor that is formed to have trench type gates in order to provide transistor 16 with a very low on-resistance. In other embodiments transistor 16 may not have trench type gates or may not be a power transistor.

Figure 2:
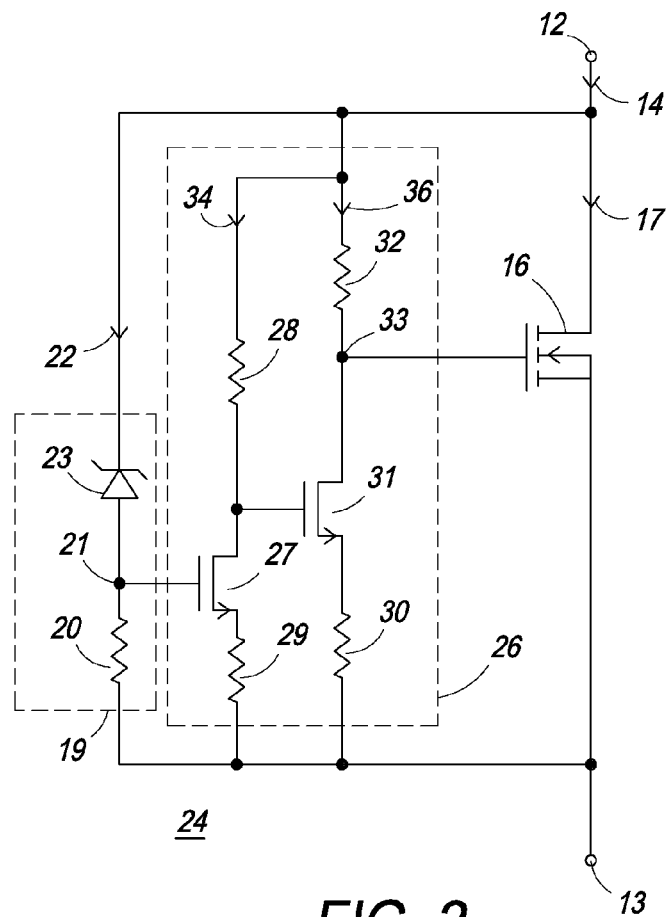
FIG. 2 schematically illustrates a more detailed embodiment of the semiconductor device of FIG. 1 in accordance with the present invention.

FIG. 2 schematically illustrates a portion of an embodiment of a semiconductor device 24 that is an exemplary embodiment of device 10. Device 24 includes a reference circuit 19 that is an embodiment of reference circuit 18 and an amplifier 26 that is an embodiment of amplifier 25. Reference circuit 19 includes a zener diode 23 and resistor 20 that are coupled in series between terminals 12 and 13. A common node is formed between diode 23 and resistor 20 functions as output 21. The exemplary embodiment of amplifier 26 includes a transistor 27 and a transistor 31 that are configured to form a transistor gain stage that amplifies the reference voltage from output 21 and forms a drive signal on output 33.

During a transient event, the value of the voltage on terminal 81 (FIG. 1) rapidly increases and causes the voltage on input terminal 12 to also rapidly increase. When the value of the voltage between terminals 12 and 13 of device 24 is greater than a threshold voltage of reference 19, for example greater than the zener voltage of diode 23, current 14 begins to flow from terminal 12 through diode 23 and resistor 20 to terminal 13 as a current 22. The value of current 22 increases until the value of the reference voltage on output 21 is greater than the threshold voltage of transistor 27 which begins to enable transistor 27. Enabling transistor 27 causes transistor 27 to conduct a current 34 through transistor 27 and resistors 28 and 29. The value of resistors 28 and 29 are selected so that a small current through transistor 27 and resistor 29 forms a voltage on the drain of transistor 27 that is less than the threshold voltage of transistor 31 thereby disabling transistor 31. Disabling transistor 31 allows a current 36 to flow through resistor 32 and charge the gate capacitance of transistor 16 thereby enabling transistor 16. The value of resistor 30 is chosen so that a small value of current 36 forms the drive voltage to be greater than the threshold voltage of transistor 16 thereby enabling transistor 16. Enabling transistor 16 causes transistor 16 to conduct current 17 and clamp the voltage between terminals 12 and 13 to a voltage that is approximately equal to the drain-to-source voltage (Vds) of transistor 16. Thus, the threshold voltage of device 24 is the input voltage value that results in enabling transistor 16 to clamp terminal 12. This threshold voltage usually is approximately equal to the input voltage that enables diode 23 to conduct current 22 plus the threshold voltage of transistor 27. Because a transient event usually has a large amount of energy, the value of current 14 usually continues to increase as a result of the transient event. Because of the low on-resistance, transistor 16 conducts substantially all of this additional current as current 17. Only a small portion of current 14 is conducted through diode 23 or amplifier 26. Consequently, as the value of current 14 increases the voltage drop across diode 19 has a very small variation for a very large variation of current 14. Also, amplifier 26 usually has a large gain so that a small increase of the reference voltage on output 21 causes a large increase of the drive voltage applied to the gate of transistor 16 thereby allowing the value of current 17 to increase without a substantial change in the value of the voltage between terminals 12 and 13. As a result, the voltage between terminals 12 and 13 has a very small variation for a large change in the value of current 14. The gain of the amplifier 26 generally is about one hundred or greater in order to form a low impedance for device 24.

Those skilled in the art will appreciate that resistors 29 and 30 also are used to control the gain of the amplifier so that the amplifier is stable and does not oscillate. In some embodiments, either or both of resistors 29 and 30 may be omitted.

Figure 3:
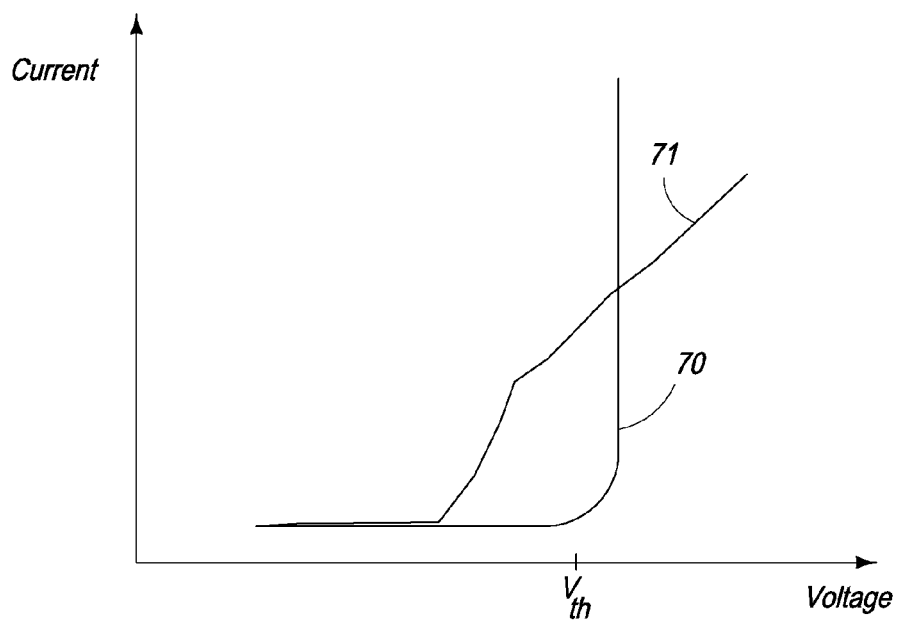
FIG. 3 is a graph having plots of some of the V-I characteristics of the semiconductor device of FIG. 2 in accordance with the present invention.

FIG. 3 is a graph illustrating the V-I characteristic curve of devices 10 and 24. The abscissa indicates the voltage between terminals 12 and 13 and the ordinate indicates increasing value of current 17. A plot 70 illustrates the V-I characteristic of devices 10 and 24. A plot 71 illustrates a typical V-I characteristic of a prior art TVS or TSD. As can be seen, once the input voltage between terminals 12 and 13 reaches the threshold voltage of devices 10 and 24, the value of current 14 rapidly increase for a very small change of the voltage between terminals 12 and 13.

In one example embodiment of device 24, diode 23 had a reverse breakdown voltage or a zener voltage of about five and one-half volts (5.5V), and the value of resistors 28, 29, 30, and 32 were, respectively, seven hundred thousand ohms (700 KΩ), twenty thousand ohms (20 KΩ), two thousand ohms (2 KΩ), and twenty thousand ohms (20 KΩ). The resulting threshold voltage of device 24 was about seven volts (7V). As the input voltage reached about seven volts (7V) the value of current 14 was about one milli-amperes (1 mA). As the value of current 17 (and current 14) increased to about five amperes (5 A) the value of the voltage across terminals 12 and 13 increased to about seven and one-tenth volts (7.1V). This represents a variation from the target value of only about one and fourth tenths of a percent (1.4%). It is believed that prior art devices would have a variation of at least five percent (5%). The above example results in an impedance for device 24 of about twenty milli-ohms (20 mΩ). This is much lower than the impedance of prior art devices which generally were about one to ten (1-10) ohms. The value of current 14 could be even larger and in some cases may be ten amperes (10 A) or larger.

In order to facilitate these advantages of device 24, output 21 is connected to an input of amplifier 26. An anode of diode 23 is connected to output 21 and a cathode is connected to terminal 12. A first terminal of resistor 20 is connected to output 21 and a second terminal is connected to terminal 13. A gate of transistor 27 is connected to the input of amplifier 26 and a source of transistor 27 is connected to a first terminal of resistor 29. A second terminal of resistor 29 is connected to terminal 13. A drain of transistor 27 is commonly connected to a gate of transistor 31 and a first terminal of resistor 28. A second terminal of resistor 28 is connected to input terminal 12. A source of transistor 31 is connected to a first terminal of resistor 30 which has a second terminal connected to terminal 13. A drain of transistor 31 is commonly connected to output 33 and to a first terminal of resistor 32. A second terminal of resistor 32 is connected to terminal 12. The gate of transistor 16 is connected to output 33, a source of transistor 16 is connected to terminal 13, and a drain is connected to terminal 12.

Figure 4:
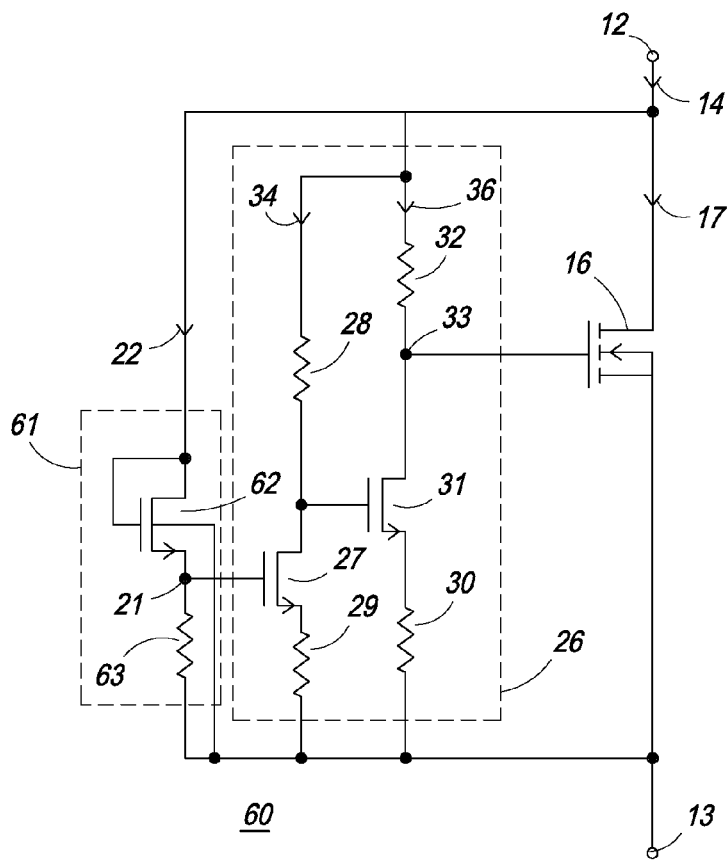
FIG. 4 schematically illustrates a portion of an embodiment of a semiconductor device that is an alternate embodiment of the semiconductor device of FIG. 2 in accordance with the present invention.

FIG. 4 schematically illustrates a portion of an exemplary embodiment of a semiconductor device 60 that is an alternate embodiment of devices 10 and 24 that were explained in the description of FIGS. 1-3. Device 60 is similar to device 24 except that reference circuit 19 is replaced by a reference circuit 61. Reference circuit 61 includes an MOS transistor 62 and a resistor 63. Reference circuit 61 functions similarly to reference circuit 18 except that transistor 62 replaces diode 23, and resistor 63 replaces resistor 20. The gate of transistor 62 is connected to the drain so that transistor 62 functions as a diode. The body of transistor 62 is connected to terminal 13 instead of to the source of transistor 62 so that the body is connected to the lowest voltage received by device 60.

As the value of the input voltage reaches the threshold voltage of reference 61, transistor 62 begins to conduct current 22. Current 22 forms a voltage across resistor 63 and at output 21. When current 22 is sufficient for the voltage on output 21 to approximately equal the threshold voltage of transistor 27, transistor begins to conduct. The remainder of the operation of device 60 is the same as device 24. Thus, the threshold voltage for device 60 is the threshold voltage of reference 61 plus the threshold voltage of transistor 27.

In order to facilitate the advantages of device 60, a first terminal of resistor 63 is connected to terminal 13 and a second terminal of resistor is connected to output 21. A source of transistor 62 is connected to output 21 and a gate and drain are commonly connected to terminal 12.

Figure 5:
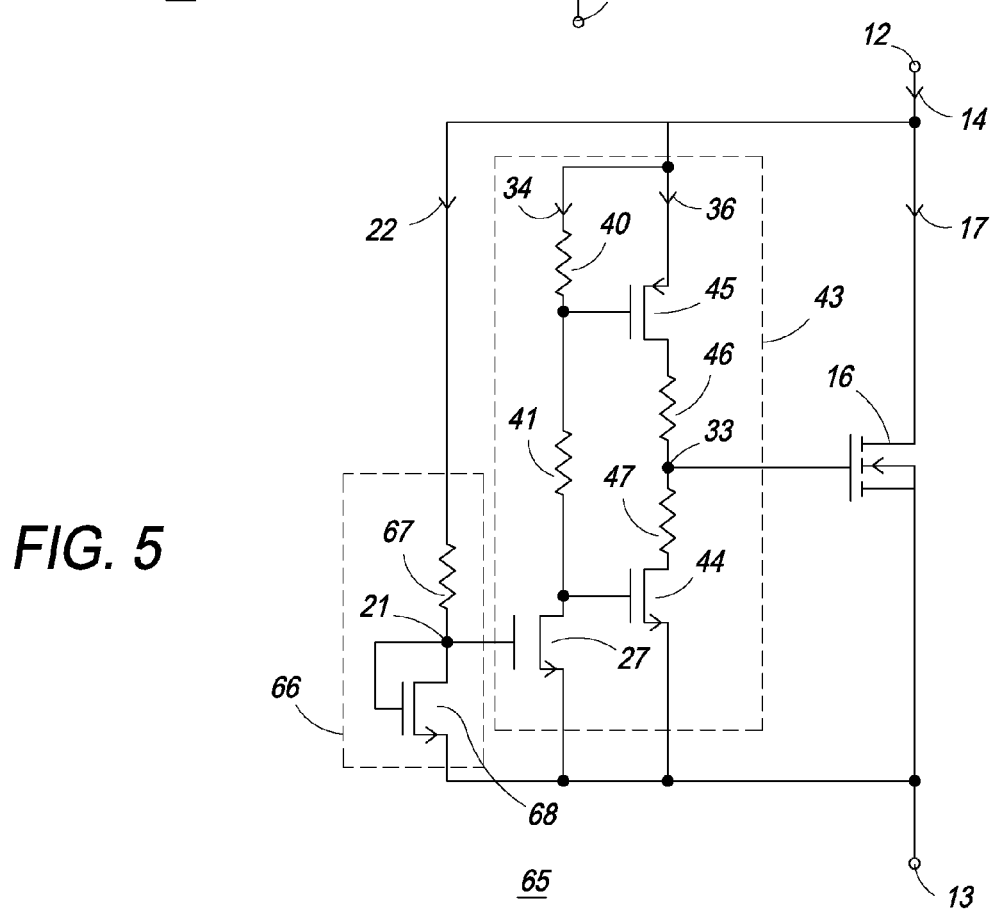
FIG. 5 schematically illustrates a portion of an embodiment of another semiconductor device that is an alternate embodiment of the semiconductor device of FIG. 2 in accordance with the present invention.

FIG. 5 schematically illustrates a portion of an exemplary embodiment of a semiconductor device 65 that is an alternate embodiment of device 24 (FIGS. 2 and 3) and device 60 (FIG. 4). Device 65 includes a reference circuit 66 that is an alternate embodiment of circuits 19 and 61. Circuit 66 includes a transistor 68 and a resistor 67. Device 65 also includes an amplifier 43 that is an alternate embodiment of amplifier 26. Amplifier 43 includes transistor 27, resistor 40 and 41, transistors 44 and 45, and resistors 46 and 47. Reference circuit 66 functions similarly to circuit 19. Since transistor 68 is in a diode configuration, the threshold voltage of circuit 66 can be formed to be much lower than the threshold voltage of circuit 19 and can easily be less than five volts (5V). Thus, the threshold of device 65 generally is lower than the threshold voltage of devices 24 and 60. In normal operation of amplifier 26 (FIGS. 2 and 4) at input voltages that are less than the threshold voltage of device 24, there is some current that flows through transistor 31 and that current keeps transistor 16 disabled. The value of this current is small but may be undesirable in some applications. Amplifier 43 is configured to reduce the value of the such current. Preferably, transistors 44 and 45 are N-channel and P-channel transistors, respectively, in order to assist in reducing the current and to reduce the response time of device 65 as will be seen further hereinafter.

During normal operation of device 65, transistor 27 is off so resistor 40 pulls the gate of transistor 45 to the voltage on input terminal 12 and disables transistor 45. The voltage on the gate of transistor 45 also enables transistor 44 which pulls the gate of transistor 16 near to the voltage of terminal 13 thereby disabling transistor 16. Since transistor 45 is disabled, current 36 does not flow even though transistor 44 is enabled, and since transistor 27 is disabled current 34 also does not flow, thereby lowering the power dissipation of device 65.

During a transient event, the voltage between terminals 12 and 13 increases to the value of the threshold voltage of circuit 66 which enables transistor 68 and current 22 flows through resistor 67 forming a voltage on output 21. When transistor 68 is enabled, the gate-to-source voltage of transistor 68 is applied to the gate of transistor 27 thereby enabling transistor 27. Transistor 27 pulls the gate of transistor 44 to a voltage near the voltage on terminal 13 thereby disabling transistor 44. Current 34 flowing through resistors 40 and 41 forms a voltage that pulls the gate of transistor 45 to a voltage that is lower than the voltage of terminal 12 by at least a threshold voltage of transistor 45 thereby enabling transistor 45. The value of resistors 40 and 41 are selected to provide this operation and ensure that transistor 45 is enabled and that transistor 44 is disabled. Transistor 45 has sufficient gain to quickly enable transistor 16. Using the active pull-up of transistor 45 instead of the resistive pull-up of amplifier 26 (FIG. 2) facilitates more rapidly enabling transistor 16 and providing an even sharper knee for device 65. The active pull-up also reduces the bias current when device 65 is operating at input voltages that are less than the threshold voltage of device 65 thereby reducing the power dissipation. Those skilled in the art will understand that the configuration of transistors 44 and 45 may be used in any of devices 24 and 60 in addition to device 65.

A source of transistor 68 is connected to terminal 13 and a gate is commonly connected to a drain of transistor 68, to output 21, and to a first terminal of resistor 67. A second terminal of resistor 67 is connected to terminal 12. A gate of transistor 27 is connected to output 21 and a source of transistor 27 is connected to terminal 13. A drain of transistor 27 is commonly connected to a gate of transistor 44 and a first terminal of resistor 41. A second terminal of resistor 41 is commonly connected to a gate of transistor 45 and to a first terminal of resistor 40. A second terminal of resistor 40 is commonly connected to terminal 12 and to a source of transistor 45. A drain of transistor 45 is connected to a first terminal of resistor 46. A second terminal of resistor 46 is commonly connected to output 33 and a first terminal of resistor 47. A second terminal of resistor 47 is connected to a drain of transistor 44 which has a source connected to terminal 13.

Figure 6:
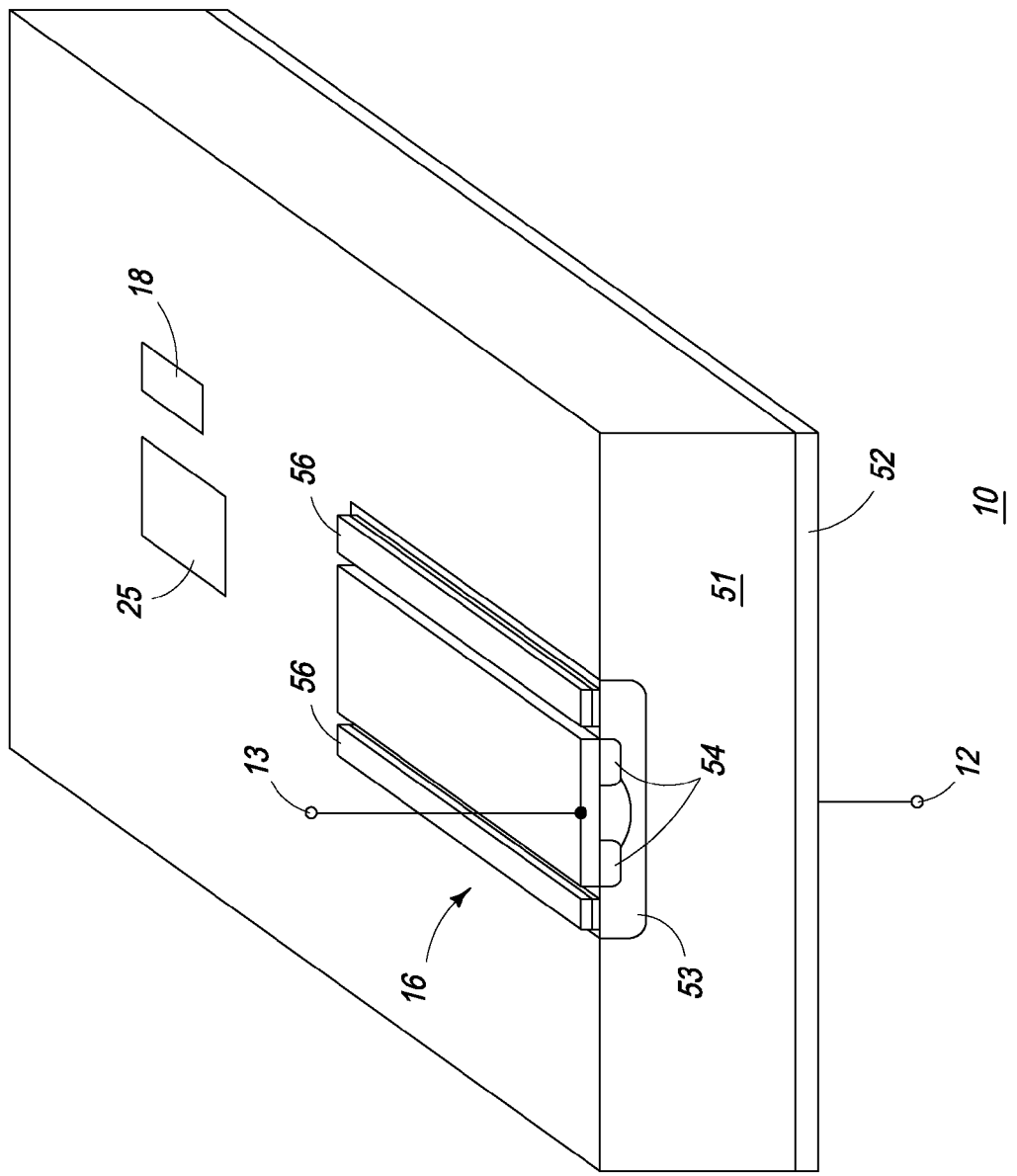
FIG. 6 illustrates a cross-sectional isometric view of a portion of an embodiment of the semiconductor device of FIG. 1 in accordance with the present invention.

FIG. 6 illustrates a cross-sectional isometric view of a portion of device 10. The drawing is a simplified view and omits some elements of device 10 for clarity of the explanation. Device 10 is formed on a semiconductor substrate 51 which has a conductor 52 attached to a back surface of substrate 51 and typically is connected to terminal 12. A doped region 53 is generally formed on the surface of substrate 51 to facilitate forming transistor 16. Doped regions 54 generally are formed on the surface of substrate 51 and within region 53 in order to form source regions for transistor 16. Regions 53 and 54 generally have an opposite conductivity type. Gate structures 56 typically are formed adjacent to regions 54 and overlying region 53 to function as the gate of transistor 16. A conductor typically is applied to form electrical contact to regions 54 and terminal 13. Those skilled in the art realize that transistor 16 may include various other elements that are not illustrated in FIG. 6 for clarity of the drawing such as trench type gate structures. Those skilled in the art will appreciate that any of devices 24, 60, and 65 may be formed on substrate 51 in a manner similar to device 10.

In view of all of the above, it is evident that a novel device and method is disclosed. Included, among other features, is forming a vertical MOS transistor to clamp the input and output terminals to a low voltage. An amplifier is used to amplify a reference signal from a reference circuit and enable the vertical MOS transistor. The gain of the amplifier and the low on-resistance of the vertical MOS transistor assist in keeping the clamp voltage to a low value for large values of current thereby providing the desired protection.

While the subject matter of the invention is described with specific preferred and exemplary embodiments, it is evident that many alternatives and variations will be apparent to those skilled in the art. As will be appreciated by those skilled in the art, the exemplary form of transistor 16 as a vertical MOS power transistor and the exemplary form of the reference circuits are used as vehicles to explain the operation method of amplifying the reference signal and clamping the voltage. Those skilled in the art will understand that various types of reference circuits and amplifier circuits may be used instead of the exemplary embodiments illustrated herein. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A TSD device comprising:
a semiconductor substrate;
a vertical MOS transistor formed on the semiconductor substrate and having a drain coupled to a first terminal of the TSD device, a source coupled to a second terminal of the TSD device, and also having a gate, and a gate-to-source enabling threshold voltage;
a voltage reference circuit formed on the semiconductor substrate and coupled between the first and second terminals of the TSD device to receive an input voltage, the voltage reference circuit having an output configured to form a reference voltage in response to the input voltage increasing to a first value that is greater than a threshold voltage of the voltage reference circuit wherein the reference voltage has a value that is less than the gate-to-source enabling threshold voltage of the vertical MOS transistor;
a first transistor formed on the semiconductor substrate, the first transistor coupled to receive the reference voltage and form a signal to enable the vertical MOS transistor responsively to the voltage reference circuit forming the reference voltage wherein the vertical MOS transistor clamps the first terminal of the TSD device to a second value that is greater than the first value as a current through the vertical MOS transistor increases from a first value to a second value;
the voltage reference circuit including a second transistor having a control electrode coupled to a first current carrying electrode of the second transistor, a second current carrying electrode, and a body of the second transistor coupled to the second terminal of the TSD device, the voltage reference circuit including a resistor coupled between the second current carrying electrode of the second transistor and the second terminal of the TSD device.

2. The TSD device of claim 1 further including a third transistor formed on the semiconductor substrate and coupled to receive the signal from the first transistor and apply a gate voltage to the gate of the vertical MOS transistor.

3. The TSD device of claim 2 wherein the third transistor includes a source coupled to the second terminal of the TSD device, and a drain and further including a fourth transistor formed on the semiconductor substrate and having a source coupled to the first terminal of the TSD device, a drain commonly coupled to the gate of the vertical MOS transistor and to the drain of the third transistor wherein the third transistor is an N-channel MOS transistor and the fourth transistor is a P-channel MOS transistor.

4. The TSD device of claim 1 further including a CMOS transistor pair configured to receive the signal from the first transistor and responsively enable the vertical MOS transistor.

5. The TSD device of claim 1 wherein the second value of the current through the vertical MOS transistor is greater than one ampere.

6. The TSD device of claim 1 wherein the second value of the current through the vertical MOS transistor is between five and ten amperes.

7. A TSD device comprising:
a semiconductor substrate;
a vertical MOS transistor formed on the semiconductor substrate and having a drain coupled to a first terminal of the TSD device, a source coupled to a second terminal of the TSD device, and also having a gate, and a gate-to-source enabling threshold voltage;
a voltage reference circuit formed on the semiconductor substrate and coupled between the first and second terminals of the TSD device to receive an input voltage, the voltage reference circuit having an output configured to form a reference voltage in response to the input voltage increasing to a first value that is greater than a threshold voltage of the voltage reference circuit wherein the reference voltage has a value that is less than the gate-to-source enabling threshold voltage of the vertical MOS transistor; and
a first transistor formed on the semiconductor substrate, the first transistor coupled to receive the reference voltage and form a signal to enable the vertical MOS transistor responsively to the voltage reference circuit forming the reference voltage wherein the vertical MOS transistor clamps the first terminal of the TSD device to a second value that is greater than the first value as a current through the vertical MOS transistor increases from a first value to a second value.

8. The TSD device of claim 7 wherein the first transistor includes a control electrode coupled to receive the reference voltage and a first current carrying electrode coupled to receive the input voltage, and further including;
a third transistor having a first current carrying electrode, a second current carrying electrode coupled to the gate of the vertical MOS transistor, and a control electrode coupled to the first current carrying electrode of the first transistor;
a first resistor having a first terminal coupled to the control electrode of the third transistor and a second terminal;
a fourth transistor having a control electrode coupled to the second terminal of the resistor, a first current carrying electrode coupled to receive the input voltage, and a second current carrying electrode coupled to the gate of the vertical MOS transistor; and
a second resistor having a first terminal coupled to the control electrode of the fourth transistor and a second terminal coupled to the first current carrying electrode of the third transistor.

9. The TSD device of claim 8 wherein the voltage reference circuit includes a fifth transistor coupled in a diode configuration with a first current carrying electrode coupled cc receive the input voltage and one of a control electrode or a second current carrying electrode coupled to the control electrode of the first transistor.

* * * * *